United States Patent
Eldridge et al.

(10) Patent No.: US 6,937,037 B2
(45) Date of Patent: Aug. 30, 2005

(54) PROBE CARD ASSEMBLY FOR CONTACTING A DEVICE WITH RAISED CONTACT ELEMENTS

(75) Inventors: Benjamin N. Eldridge, Danville, CA (US); Gary W. Grube, Pleasanton, CA (US); Gaetan L. Mathieu, Livermore, CA (US)

(73) Assignee: Formfactor, et al., Livermore, CA (US)

( * ) Notice: Subject to any disclaimer, the term of this patent is extended or adjusted under 35 U.S.C. 154(b) by 0 days.

(21) Appl. No.: 10/198,198

(22) Filed: Jul. 16, 2002

(65) Prior Publication Data

US 2003/0038647 A1 Feb. 27, 2003

Related U.S. Application Data

(63) Continuation of application No. 09/204,740, filed on Dec. 2, 1998, now Pat. No. 6,483,328, which is a continuation-in-part of application No. 08/554,902, filed on Nov. 9, 1995, now Pat. No. 5,974,662.

(51) Int. Cl.$^7$ .............................................. G01R 31/26
(52) U.S. Cl. ...................................... 324/754; 324/761
(58) Field of Search .............................. 324/754, 755, 324/761–762, 765; 439/66–72; 438/14–18

(56) References Cited

U.S. PATENT DOCUMENTS

| | | |
|---|---|---|
| 2,967,216 A | 1/1961 | Zablocki et al. |
| 3,654,585 A | 4/1972 | Wickersham |
| 3,663,920 A | 5/1972 | Lapham |
| 3,676,776 A | 7/1972 | Bauer et al. |
| 3,714,384 A | 1/1973 | Burkhardt |
| 3,771,110 A | 11/1973 | Reed |
| 3,810,301 A | 5/1974 | Cook |
| 3,826,984 A | 7/1974 | Epple |
| 3,832,632 A | 8/1974 | Ardezzone |
| 3,835,530 A | 9/1974 | Kilby |

(Continued)

FOREIGN PATENT DOCUMENTS

| | | |
|---|---|---|
| DE | 4237591 | 5/1994 |
| EP | 295914 | 12/1988 |
| EP | 369112 | 5/1990 |
| EP | 396248 | 11/1990 |
| EP | 402756 | 12/1990 |
| EP | 413042 | 2/1991 |
| EP | 544305 A2 | 6/1993 |
| EP | 632281 | 1/1995 |
| GB | 1446196 | 8/1976 |
| JP | 58-8960 | 1/1983 |

(Continued)

OTHER PUBLICATIONS

"Robust Method Using Simple Unit Processes For Thin Film Cu–Polyimide Packaging Structures," IBM Technical Disclosure Bulletin, vol. 34, No. 10A (Mar. 1992), pp. 368–369.

(Continued)

*Primary Examiner*—Vinh P. Nguyen
(74) *Attorney, Agent, or Firm*—N. Kenneth Burraston

(57) ABSTRACT

A probe card is provided for probing a semiconductor wafer with raised contact elements. In particular, the present invention is useful with resilient contact elements, such as springs. A probe card is designed to have terminals to mate with the contact elements on the wafer. In a preferred embodiment, the terminals are posts. In a preferred embodiment the terminals include a contact material suitable for repeated contacts. In one particularly preferred embodiment, a space transformer is prepared with contact posts on one side and terminals on the opposing side. An interposer with spring contacts connects a contact on the opposing side of the space transformer to a corresponding terminal on a probe card, which terminal is in turn connected to a terminal which is connectable to a test device such as a conventional tester.

37 Claims, 5 Drawing Sheets

U.S. PATENT DOCUMENTS

| | | |
|---|---|---|
| 3,842,189 A | 10/1974 | Southgate |
| 3,891,924 A | 6/1975 | Ardezzone et al. |
| 3,939,414 A | 2/1976 | Roch |
| 3,994,552 A | 11/1976 | Selvin |
| 4,032,058 A | 6/1977 | Riseman |
| 4,038,599 A | 7/1977 | Bove et al. |
| 4,085,502 A | 4/1978 | Ostman et al. |
| 4,281,449 A | 8/1981 | Ports et al. |
| 4,307,928 A | 12/1981 | Petlock, Jr. |
| 4,338,621 A | 7/1982 | Braun |
| 4,358,175 A | 11/1982 | Reid |
| 4,466,184 A | 8/1984 | Cuneo et al. |
| 4,537,808 A | 8/1985 | Yamamoto et al. |
| 4,548,451 A | 10/1985 | Bennarr et al. |
| 4,553,192 A | 11/1985 | Babuka et al. |
| 4,567,432 A | 1/1986 | Buol et al. |
| 4,567,433 A | 1/1986 | Ohkubo et al. |
| 4,593,958 A | 6/1986 | Baba |
| 4,615,573 A | 10/1986 | White et al. |
| 4,616,404 A | 10/1986 | Wang et al. |
| 4,623,839 A | 11/1986 | Garretson et al. |
| 4,707,655 A | 11/1987 | Kruger |
| 4,707,657 A | 11/1987 | Boegh-Petersen |
| 4,773,877 A | 9/1988 | Kruger et al. |
| 4,795,977 A | 1/1989 | Frost et al. |
| 4,831,614 A | 5/1989 | Duerig et al. |
| 4,866,504 A | 9/1989 | Landis |
| 4,893,172 A | 1/1990 | Matsumoto et al. |
| 4,924,589 A | 5/1990 | Leedy |
| 4,932,883 A | 6/1990 | Hsia et al. |
| 4,947,481 A | 8/1990 | Ikedo et al. |
| 4,955,523 A | 9/1990 | Calomagno et al. |
| 4,965,865 A | 10/1990 | Trenary |
| 4,969,826 A | 11/1990 | Grabbe |
| 4,983,907 A | 1/1991 | Crowley |
| 4,993,957 A | 2/1991 | Shino |
| 5,017,738 A | 5/1991 | Tsuji et al. |
| 5,055,780 A | 10/1991 | Takagi et al. |
| 5,067,007 A | 11/1991 | Otsuka et al. |
| 5,070,297 A | 12/1991 | Kwon et al. |
| 5,071,359 A | 12/1991 | Arnio et al. |
| 5,072,520 A | 12/1991 | Nelson |
| 5,090,118 A | 2/1992 | Kwon et al. |
| 5,103,557 A | 4/1992 | Leedy |
| 5,109,596 A | 5/1992 | Driller et al. |
| 5,130,779 A | 7/1992 | Agarwala et al. |
| 5,139,427 A | 8/1992 | Boyd et al. |
| 5,148,103 A | 9/1992 | Paciecznik, Jr. |
| 5,152,695 A | 10/1992 | Grabbe et al. |
| 5,177,438 A | 1/1993 | Littlebury et al. |
| 5,177,439 A | 1/1993 | Liu et al. |
| 5,187,020 A | 2/1993 | Kwon et al. |
| 5,189,507 A | 2/1993 | Carlomagno et al. |
| 5,191,708 A | 3/1993 | Kasukabe et al. |
| 5,210,939 A | 5/1993 | Mallik et al. |
| 5,221,895 A | 6/1993 | Janko et al. |
| 5,228,861 A | 7/1993 | Grabbe |
| 5,237,743 A | 8/1993 | Busacco et al. |
| 5,245,751 A | 9/1993 | Locke et al. |
| 5,264,787 A * | 11/1993 | Woith et al. ................. 324/758 |
| 5,308,443 A | 5/1994 | Sugihara |
| 5,308,797 A | 5/1994 | Kee |
| 5,317,479 A | 5/1994 | Pai et al. |
| 5,329,226 A | 7/1994 | Monnet et al. |
| 5,354,712 A | 10/1994 | Ho et al. |
| 5,379,515 A | 1/1995 | Kondo et al. |
| 5,391,521 A | 2/1995 | Kim |
| 5,395,253 A | 3/1995 | Crumly |
| 5,399,982 A | 3/1995 | Driller et al. |
| 5,412,329 A | 5/1995 | Iino et al. |
| 5,437,556 A | 8/1995 | Bargain et al. |
| 5,455,390 A | 10/1995 | Di Stefano et al. |
| 5,465,611 A | 11/1995 | Ruf et al. |
| 5,469,733 A | 11/1995 | Yasue et al. |
| 5,471,151 A | 11/1995 | Di Francesco |
| 5,475,318 A | 12/1995 | Marcus et al. |
| 5,476,211 A | 12/1995 | Khandros |
| 5,476,818 A | 12/1995 | Yanof et al. |
| 5,483,741 A | 1/1996 | Akram et al. |
| 5,491,426 A | 2/1996 | Small |
| 5,513,430 A | 5/1996 | Yanof et al. |
| 5,521,518 A | 5/1996 | Higgins |
| 5,521,522 A | 5/1996 | Abe et al. |
| 5,534,784 A * | 7/1996 | Lum et al. .................. 324/757 |
| 5,555,422 A | 9/1996 | Nakano |
| 5,629,631 A | 5/1997 | Perry et al. |
| 5,632,631 A | 5/1997 | Fjelstad et al. |
| 5,666,190 A | 9/1997 | Quate et al. |
| 5,686,317 A | 11/1997 | Akram et al. |
| 5,686,842 A | 11/1997 | Lee |
| 5,701,085 A | 12/1997 | Malladi et al. |
| 5,720,098 A | 2/1998 | Kister |
| 5,772,451 A | 6/1998 | Dozier, II et al. |
| 5,806,181 A | 9/1998 | Khandros et al. |
| 5,811,982 A | 9/1998 | Beaman et al. |
| 5,821,763 A | 10/1998 | Beaman et al. |
| 5,828,226 A | 10/1998 | Higgins et al. |
| 5,852,871 A | 12/1998 | Khandros |
| 5,864,946 A | 2/1999 | Eldridge et al. |
| 5,900,738 A | 5/1999 | Khandros et al. |
| 5,917,707 A | 6/1999 | Khandros et al. |
| 5,974,662 A | 11/1999 | Eldridge et al. |
| 6,002,266 A | 12/1999 | Briggs |
| 6,014,032 A | 1/2000 | Maddix et al. |
| 6,016,060 A | 1/2000 | Akram et al. |
| 6,029,344 A | 2/2000 | Khandros et al. |
| 6,032,356 A | 3/2000 | Eldridge et al. |
| 6,043,668 A | 3/2000 | Carney |
| 6,046,597 A | 4/2000 | Barabi |
| 6,049,214 A | 4/2000 | Nishikawa et al. |
| 6,050,829 A | 4/2000 | Eldridge et al. |
| 6,064,213 A | 5/2000 | Khandros et al. |
| 6,081,429 A | 6/2000 | Barrett |
| 6,087,840 A | 7/2000 | Mizuta |
| 6,091,252 A | 7/2000 | Akram et al. |
| 6,097,202 A | 8/2000 | Takahashi |
| 6,107,812 A | 8/2000 | Pivnichny et al. |
| 6,110,823 A | 8/2000 | Eldridge et al. |
| 6,133,744 A | 10/2000 | Yojima et al. |
| 6,140,830 A | 10/2000 | Ott |
| 6,144,212 A | 11/2000 | Mizuta |
| 6,147,505 A | 11/2000 | Ott et al. |
| 6,150,830 A | 11/2000 | Schmid et al. |
| 6,160,412 A | 12/2000 | Martel et al. |
| 6,166,552 A | 12/2000 | O'Connell |
| 6,177,805 B1 | 1/2001 | Pih |
| 6,181,144 B1 | 1/2001 | Hembree et al. |
| 6,184,053 B1 | 2/2001 | Eldridge et al. |
| 6,188,231 B1 | 2/2001 | Palagonia |
| 6,188,286 B1 | 2/2001 | Hogl et al. |
| 6,215,320 B1 | 4/2001 | Parrish |
| 6,219,908 B1 | 4/2001 | Farnwirth et al. |
| 6,246,247 B1 | 6/2001 | Eldridge et al. |
| 6,330,164 B1 | 12/2001 | Khandros et al. |
| 6,334,247 B1 | 1/2002 | Beaman et al. |
| 6,336,269 B1 | 1/2002 | Eldridge et al. |
| 6,392,426 B2 | 5/2002 | Farnworth et al. |

FOREIGN PATENT DOCUMENTS

| | | |
|---|---|---|
| JP | 58-178293 | 11/1983 |
| JP | 59-088860 | 5/1984 |

| | | |
|---|---|---|
| JP | 59-149070 | 10/1984 |
| JP | 61-19770 | 2/1986 |
| JP | 62-44285 | 2/1987 |
| JP | 62-160373 | 10/1987 |
| JP | 63-63777 | 4/1988 |
| JP | 63-243768 | 10/1988 |
| JP | 01-152271 | 10/1989 |
| JP | 01-255240 | 10/1989 |
| JP | 02-226996 | 10/1990 |
| JP | 03-65659 | 3/1991 |
| JP | 63-279477 | 3/1991 |
| JP | 03-292406 | 12/1991 |
| JP | 04-51535 | 2/1992 |
| JP | 04-93157 | 3/1992 |
| JP | 04-207047 | 7/1992 |
| JP | 04-214650 | 8/1992 |
| JP | 04-240570 | 8/1992 |
| JP | 04-294559 | 10/1992 |
| JP | 04-357848 | 12/1992 |
| JP | 05-018741 | 1/1993 |
| JP | 05-29406 | 2/1993 |
| JP | 05-198716 | 8/1993 |
| JP | 05-218156 | 8/1993 |
| JP | 06-018555 | 1/1994 |
| JP | 06-50990 | 2/1994 |
| JP | 06-180329 | 6/1994 |
| JP | 06-249924 | 9/1994 |
| JP | 06-265575 | 9/1994 |
| JP | 06-267408 | 9/1994 |
| JP | 06-273445 | 9/1994 |
| JP | 06-313775 | 11/1994 |
| JP | 07-021968 | 1/1995 |
| JP | 07-72172 | 3/1995 |
| JP | 07-333232 | 12/1995 |
| WO | WO 91/12706 | 8/1991 |
| WO | WO 92/10010 | 6/1992 |
| WO | WO 94/09513 | 4/1994 |
| WO | WO 96/15458 | 5/1996 |
| WO | WO 98/21597 | 5/1998 |

OTHER PUBLICATIONS

Kong et al., "Integrated electrostatically resonant scan tip for an atomic force microscope," J. Vac. Sci. Technol. B 11(3) (May/Jun. 1993), pp. 634–641.

Leung et al., "Active Substrate Membrane Probe Card," Center for Integrated Systems, Stanford University, Oct. 12, 1995, pp. 29.2.1–29.2.4.

* cited by examiner

PROBE CARD ASSEMBLY FOR CONTACTING A DEVICE WITH RAISED CONTACT ELEMENTS

This application is a continuation of application Ser. No. 09/204,740, filed Dec. 2, 1998 now U.S. Pat. No. 6,483,328, which is a continuation-in-part of U.S. patent application Ser. No. 08/554,902, filed Nov. 9, 1995, now Pat. No. 5,974,662.

FIELD OF THE INVENTION

This invention is directed to an apparatus for probing semiconductor wafers. More particularly, this invention is directed to probing a semiconductor wafer with raised contact structures. This invention is particularly well suited for probing wafers with resilient contact structures.

BACKGROUND OF THE INVENTION

It is well understood in the art of manufacturing semiconductor devices to test devices while still unsingulated from the wafer for some level of functionality. Conventionally this is done using a probe card and a prober. A representative probe card is illustrated in FIG. 1. The probe card is mounted in a prober, which in turn detects with high precision the position and orientation of the probe card, and the position and orientation of a wafer to be tested, then brings the two into precise alignment. The probe card is connected in turn to a tester, providing a connection between the tester and one or more devices on the wafer. The tester can energize the device under test (DUT) and evaluate the performance of the device. This process is repeated as needed to test substantially each device on the wafer. Devices which pass the test criteria are processed further.

One particularly useful probe card makes use of resilient spring elements for contacting the wafer. Such a probe card is illustrated in FIG. 1. This probe card is described in detail in copending U.S. patent application Ser. No. 08/554,902, filed Nov. 9, 1995, which is incorporated herein in full by reference. This probe card also is described in detail in copending, commonly assigned U.S. patent application Ser. No. 09/156,957, filed Sep. 18, 1997, which is a divisional of Ser. No. 08/554,902. This application also is incorporated herein in full by reference.

Semiconductor devices are manufactured on a semiconductor wafer but must be singulated and connected to external devices in order to function. For many years, the standard method of connecting a semiconductor involves fabricating a semiconductor device with pads, typically of aluminum. These pads are connected to larger structures, typically a lead frame, typically using wirebonding. The lead frame can be mounted in a suitable package, typically of ceramic or plastic. The spacing of connections on the package is designed to mate with a circuit board or other mating device such as a socket. Various innovations in packaging over the years allow for relatively close spacing and ever higher pin counts in packaging.

A significant change from this packaging paradigm is seen in BGA packaging. Here, the contact points are globules of a reflowable material. A solder material is commonly used, so that a package can be positioned at a contact area then heated to reflow the solder, providing a secure electrical connection. This same general strategy is used at the chip level, forming small bumps over contact areas. A commonly used process makes C4 balls (controlled collapse chip connection).

Conventional probe cards are designed to contact traditional bond pads, typically aluminum. The novel probe card of FIG. 1 is useful for this purpose as well. Probing C4 balls is more complex for a variety of reasons, but the probe card of FIG. 1 is particularly well suited for this purpose as well.

A new form of packaging has become available which allows formation of small resilient contact structures directly on a semiconductor wafer. This is the subject of several patents, including U.S. Pat. No. 5,829,128, issued Nov. 3, 1998. An illustrative embodiment is shown in FIG. 2 as wafer 208 with springs 224 connected to terminals 226.

A large scale contactor has been disclosed for contactor some or all of a semiconductor wafer which is built with resilient contact elements. Fixturing and burn-in processes are described in copending, commonly assigned U.S. patent application Ser. No. 08/784,862, filed Jan. 15, 1997, which is incorporated herein in full by reference. The corresponding PCT application was published as WO 97/43656 on Nov. 20, 1997.

SUMMARY OF THE INVENTION

The present invention provides a probe card useful for probing a semiconductor wafer with raised contact elements. In particular, the present invention is useful with resilient contact elements, such as springs.

A probe card is designed to have terminals to mate with the contact elements on the wafer. In a preferred embodiment, the terminals are posts. In a preferred embodiment the terminals include a contact material suitable for repeated contacts In one particularly preferred embodiment, a space transformer is prepared with contact posts on one side and terminals on the opposing side. An interposer with spring contacts connects a contact on the opposing side of the space transformer to a corresponding terminal on a probe card, which terminal is in turn connected to a terminal which is connectable to a test device such as a conventional tester.

It is an object of this invention to provide a probe card for probing a semiconductor device with raised contact elements.

This and other objects and advantages of the invention, as well as the details of an illustrative embodiment, will be more fully understood from the following specification and drawings.

DESCRIPTION OF THE PREFERRED EMBODIMENTS

Figure 1:
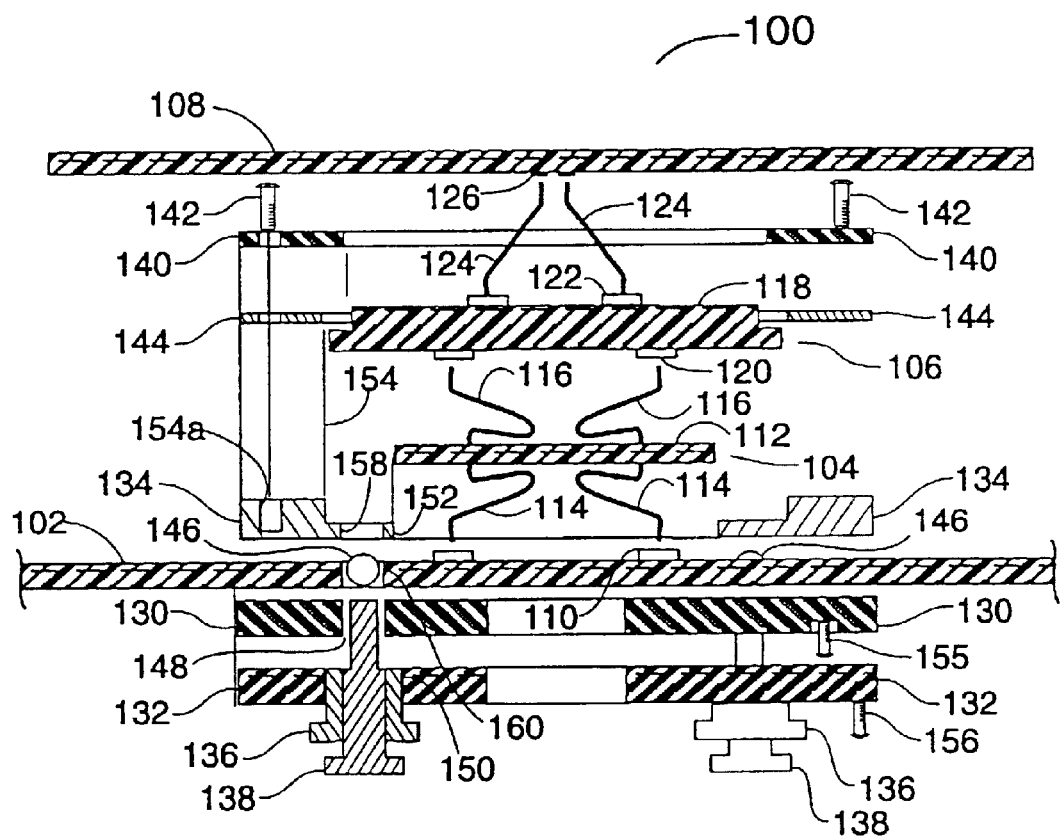
FIG. 1 illustrates a probe card for probing conventional semiconductor devices.
Figure 5:
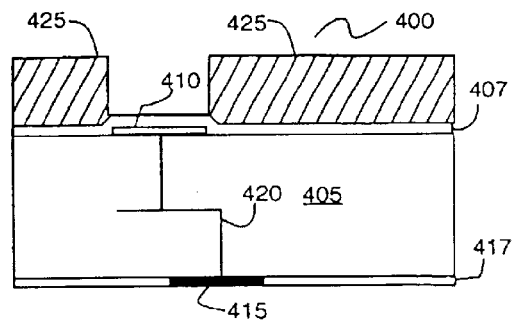
Figure 6:
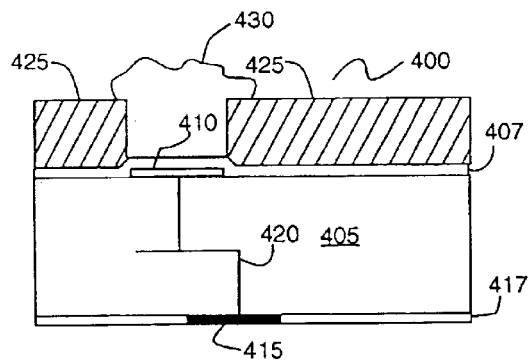
Figure 7:
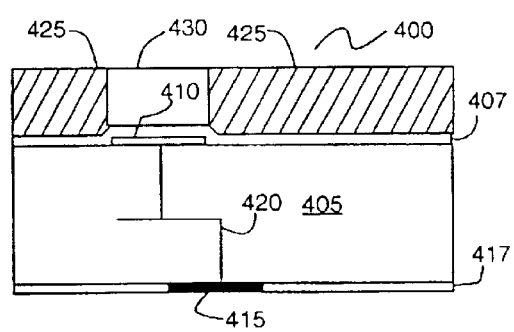

The probe card assembly of FIG. 1 has been described in detail in copending, commonly assigned U.S. patent application Ser. No. 08/554,902, filed Nov. 9, 1995, and in copending, commonly assigned U.S. patent application Ser. No. 09/156,957, filed Sep. 18, 1997. This figure is FIG. 5 in these earlier applications, and the numbers are in the 500 series, renumbered here in the 100 series.

Figure 2:
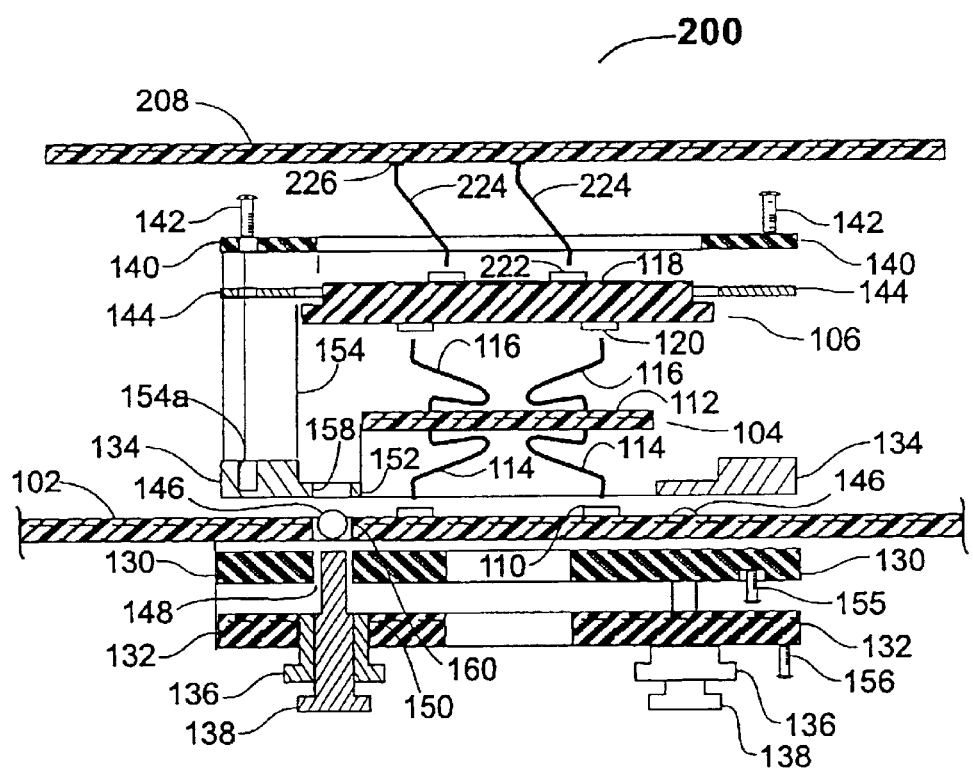
FIG. 2 illustrates a probe card for probing semiconductor devices with raised contact elements.

Referring to FIG. 2, the probe card assembly of FIG. 1 has been modified slightly for the new purpose. Common elements include supporting probe card 102 which is mounted (not shown) into a prober. Interposer 112 includes springs 114 and corresponding springs 116 which connect through the interposer so that corresponding terminals 110 and 120 are electrically connected. In space transformer 106, corresponding terminals 120 and 222 (122 in FIG. 1) are connected. Probe card 102 supports connecting circuitry so a tester lead can be connected to a corresponding terminal 110, and then through 114, 116, 120 and 222 (or 122) to receive a connection from a semiconductor device. In FIG. 1, resilient contact element 124 is connected to terminal 122, and is brought into contact with terminal 126 on semiconductor wafer 108 In FIG. 2, semiconductor wafer 208 has terminals 226 which in turn have raised contact element, here resilient contact elements 224, which can be brought into contact with corresponding terminals 222 to complete a circuit to the tester. The tester can energize a connected semiconductor device and evaluate the functionality of the device.

Interposer 112 with springs 114 and 116 pushes against terminals 114 and 120. By compressing the space transformer 118 towards the probe card 102, the interposer will maintain contact with each corresponding terminal 110 and 120 even if the planarity of the tips of springs 114, of springs 116, of terminals 110 and of terminals 120 are imperfect. Moreover, within the limits of resiliency of the various components, the space transformer can be angled relative to the probe card to allow for alignment in certain dimensions. Differential screws 138 and 136 can be adjusted very precisely to reorient the surface of space transformer 118 relative to probe card 102. Consequently, things connected to the space transformer correspondingly will be oriented. Thus the tips of springs 124 in FIG. 1 and the terminals 222 in FIG. 2 can be positioned with high accuracy relative to a semiconductor wafer.

Figure 3:
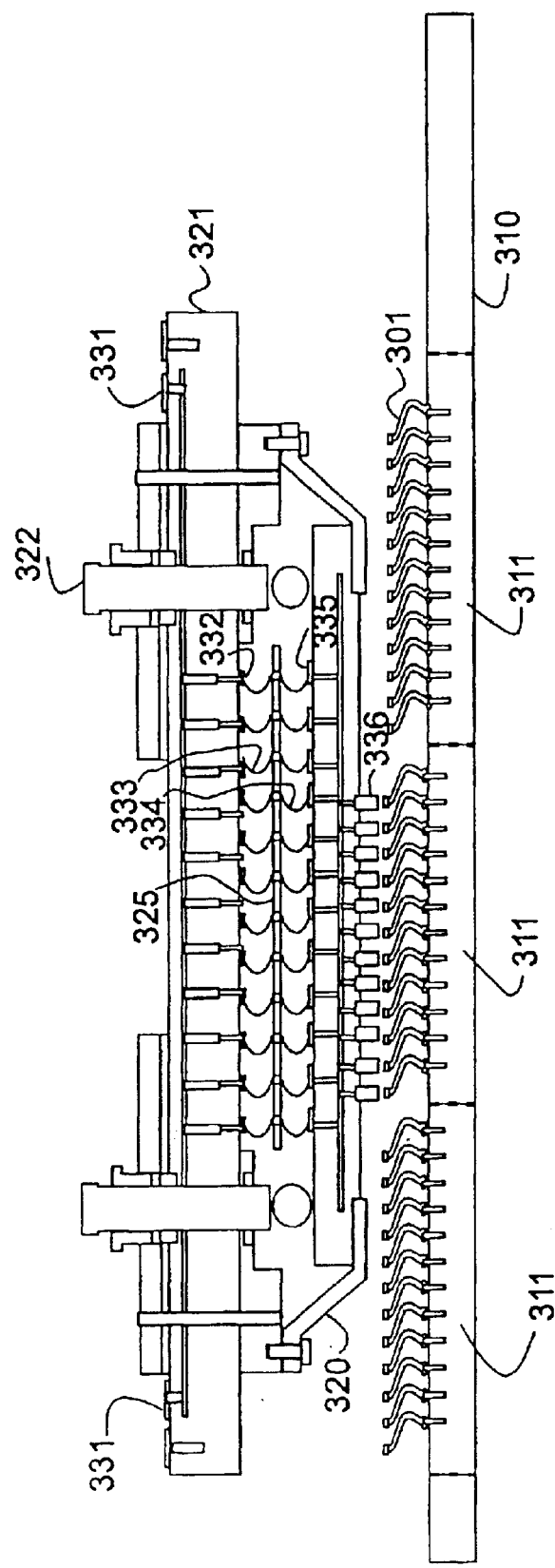
FIG. 3 illustrates a second embodiment of a probe card for probing semiconductor devices with raised contact elements.

Referring to FIG. 3, the components of FIG. 2 can be seen in an alternative embodiment. The primary elements function as described in relation to FIG. 2. Space transformer 324 supports terminals 336 and 335, which are connected appropriately. Interposer 325 supports resilient contact elements 334 and 333. Probe card 321 supports terminals 332 and 331, which are connected appropriately. In general, a lead from a tester will connect to a terminal 331, which is connected in turn to a terminal 332, then through resilient contact elements 333 and 334 to a terminal 335 and finally to a corresponding terminal 336. Support spring 320 holds the space transformer 324 against interposer 325 and probe card 321. Orienting device 322 functions as described above to refine the orientation of the space transformer relative to the prove card 321.

FIG. 3 shows a broader view of semiconductor wafer 310, here with several distinct semiconductor devices 311. Here a single semiconductor device is shown almost connected with corresponding terminals 336. By moving semiconductor wafer 310 towards probe card 321, a microspring contact 301 is brought into direct and intimate contact with a corresponding terminal 336, and connected therefore to a corresponding tester lead. After testing, the semiconductor wafer can be repositioned to bring another semiconductor device into contact with the corresponding terminals on the probe card assembly.

Figure 4:
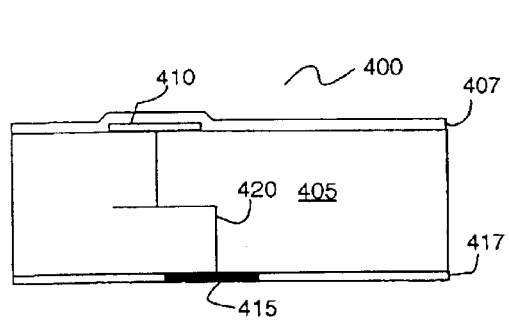
FIGS. 4 through 9 illustrate steps in the process of forming a post suitable for use in the probe card of this invention.

FIG. 4 illustrates a particularly preferred method of fabricating a post structure. Details of fabricating the interposer, space transformer, and probe card are detailed in copending, commonly assigned U.S. patent application Ser. No. 08/554,902, filed Nov. 9, 1995, and in copending, commonly assigned U.S. patent application Ser. No. 09/156,957, filed Sep. 18, 1997, and earlier applications cited in these applications.

Referring to FIG. 4, in structure 400 a support substrate 405 includes terminal 410, interconnection 420, and terminal 415. Suitable materials and alternative compositions are detailed in the referenced applications. For a preferred embodiment, the support substrate is a multilayer ceramic substrate. A conductive layer 417 connects a plurality of terminals 415 (other terminals not shown). A more detailed description of the following steps can be found in copending, commonly assigned application entitled "Lithographic Contact Elements", being filed on even date herewith, no serial number yet assigned. FIGS. 4 through 7. are adapted from FIGS. 1 through 4 of that corresponding application.

In the process of electroplating, it is advantageous to provide a common connection between elements to be plated in order to provide a suitable circuit for plating. Other methods of deposition may be used to form structures similar to the one described here. Such methods are described or references in applications Ser. No. 08/554,902 and Ser. No. 09/156,957 and supporting applications. One alternative to a shorting layer such as 417 is to provide a shorting layer 407 directly connecting a plurality of terminals 410 (only one shown here). Both are shown here but in practice generally only one or the other would be used. Use of a "top" layer such as 407 is particularly advantageous when there is no convenient way to connect through the substrate. Such might be the case when using silicon as a substrate, or certain configurations of ceramic, polyimide, or other materials.

Shorting layer 407 is applied by sputtering Details of materials, thicknesses, processing variations and the like can be found in corresponding, commonly assigned U.S. patent application Ser. No. 09/032,473, filed Feb. 26, 1998, entitled "Lithographically Defined Microelectronic Contact Structures," which is incorporated herein in full by reference. One particularly preferred material is an alloy of tungsten and titanium. This can be applied by sputtering. A useful depth is on the order of 3,000 to 6,000 Angstroms, such as about 4,500 Angstroms. Various alloys of titanium or of tungsten also are useful.

A layer of resist such as a negative photoresist 425 is applied to the surface of the substrate (on top of any other applied layers, of course). This is patterned to leave an opening over terminal 410.

A suitable structural material 430 is deposited in the opening in the photoresist, more than filling the opening. In a preferred embodiment, a material such as an alloy of nickel and cobalt is deposited by electroplating. Other useful materials include copper, palladium, palladium cobalt, and alloys including these materials. Other deposition methods such as sputtering may be suitable.

A lapping or grinding process such as chemical-mechanical polishing is used to remove excess structural material to leave a highly planar structure. Moreover, other structures on the substrate are planarized. It is desirable to have minimal height deviation both in the region of a single post as well as over a series of posts. Flatness on the order of one in 1,000 (height above surface measured at relatively distant corresponding feature) is desirable although the specific constraints of a given design may well allow for 2 to 5 to 10 in 1,000 or even more. This corresponds to a height consistency of 100 microinchs per linear inch or 1 micron per centimeter.

Figure 8:
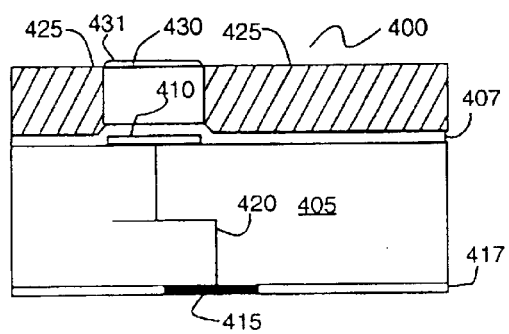

In one preferred embodiment an additional contact layer is applied. Referring to FIG. 8, a contact layer 431 is deposited onto structural material 430. In one preferred embodiment, this is deposited by electroplating. A preferred material is an alloy of palladium and cobalt. Other useful materials include palladium, hard gold, soft gold and rhodium. The thickness can be chosen by design criteria understood by those skilled in the art of making contact components. In one preferred embodiment the thickness is from about 0 to about 200 microinches (0 to about 5 microns).

Figure 9:
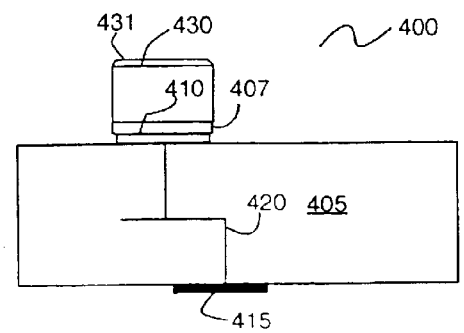

The structure is finished by stripping the masking layer of photoresist, and removing the conductive layer 407 or 417. Useful techniques include ashing, wet etch and laser ablation. Details of time, materials and conditions are extremely well known in the art. Referring to FIG. 9, the finished structure 400 then can be incorporated in a probe card assembly as shown in FIG. 2 or 3.

The geometries of the terminals are quite flexible using this method and the designer has a great degree of flexibility. It is quite simple to form posts which are approximately square in cross section (in the XY plane of the substrate surface). This can be on the order of about 1 to 10 mils. Obviously almost any size and shape can be designed here. It is convenient to make the height of the structure on the order of 0 to 60 mils (0 to 1.5 millimeters). Of course the terminal can actually be recessed below the surface of the substrate so long as the terminals collectively are highly planar. A useful height is on the order of about 5 to about 10 mils (125 to 250 microns). Another preferred embodiment includes structures which are on the order of about 40 to 60 mils (1 to 1.5 millimeters).

Orienting the probe structure so it is aligned as well as possible with the plane of the wafer to be tested is very beneficial. Having the surface of the space transformer reasonably flat is very helpful as well. Assuming that the contact ends of the resilient contact structures on the wafer ("tips" in one perspective) are generally co-planar, bringing coplanar tips into contact with coplanar terminals across aligned planes means that the tips can be depressed a minimal amount in order to guarantee contact of all tips with all terminals. Whatever amount of non-coplanarity exists in the tips, in the terminals, or in mis-alignment of the planes for contact means that some portion of the tips will have to travel further in order to guarantee that all tips are in satisfactory contact. The structure described here can readily be made relatively flat and oriented successfully to allow minimal drive on the wafer. In a preferred design, an over travel on the order of 3 mils (75 microns) is one useful design point. That is, from the point where the first tip touches a corresponding terminal, the base corresponding to that tip is driven the over travel distance closer to the terminal. This compresses the tip against the terminal and, in many designs, causes the tip to slide across the terminal, thus digging into and through any contaminants that may be present on either the tip or the terminal. This also drives other tips into contact and along corresponding terminals. If things are properly designed and aligned the selected degree of overtravel will cause the tip which is last to contact a corresponding terminal still to be able to establish a suitable contact.

Figure 10:
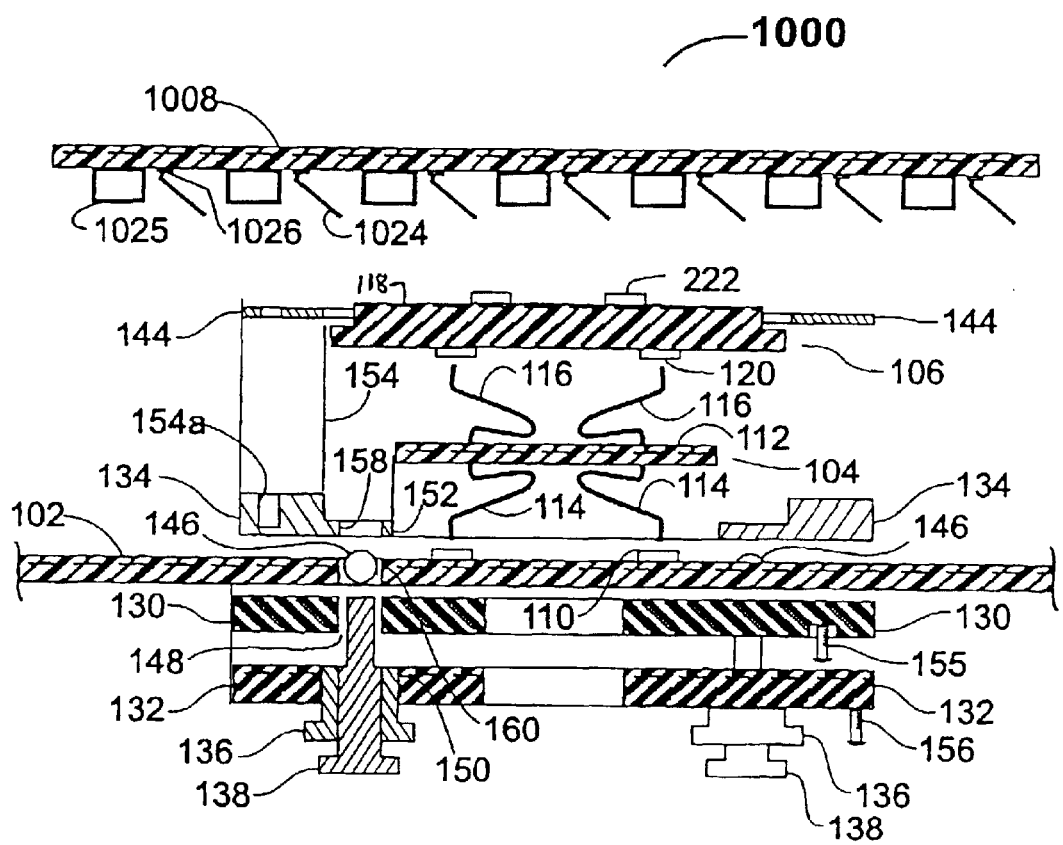
FIGS. 10 and 11 illustrate an exemplary probe card used with a wafer including travel stop protectors.

Some instances of wafers with springs include an overtravel stop protector. Such overtravel stop protectors are described in detail in copending, commonly assigned United States patent application <serial number not available>, filed Jul. 13, 1998, entitled "Interconnect Assemblies and Method", naming as a sole inventor Benjamin Eldridge. Referring to FIG. 10, one example of such an overtravel stop protector can be seen. Semiconductor wafer 1008 is fabricated to include terminals 1026, with resilient contact elements 1024. Compare 208, 226 and 226 in FIG. 2. In addition, an overtravel stop protector 1025 is included. In one preferred embodiment this takes the form of a cured epoxy. The protector can take many forms. As illustrated, the protector is more or less a field of epoxy, generally planar, with openings only for the resilient contact elements 1024. The height of the stop protector is selected so each resilient contact element can deform the desired amount but then will pass below the level of the protector, effectively limiting overtravel. A wafer with such stop protectors can be tested using the same apparatus described above in FIGS. 2 and 3.

Figure 11:
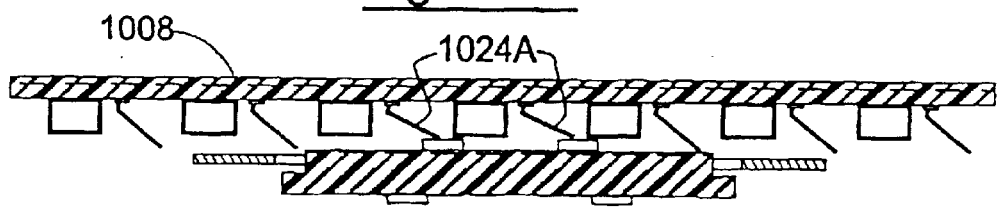

Referring to FIGS. 10 and 11, as the resilient contact elements 1024 first contact corresponding terminals 222, the resilient contact elements first touch the corresponding terminals then begin to wipe across the surface. In FIG. 11 the resilient contact elements 1024A are in contact and have been compressed to some degree. In FIG. 11, each terminal 222 has come into contact with a corresponding overtravel stop protector 1025 and will not further depress the corresponding resilient contact element 1024A If the semiconductor wafer 1008 is driven further toward probe card 102 (shown in FIG. 10), the overtravel stop protectors 1025 will press against terminals 222, driving space transformer 118 towards probe card 102. With sufficient drive force on semiconductor wafer 1008, probe card 102 will be deformed away from the semiconductor wafer. Designers can select stiffness propertied for the probe card to accommodate expected probing force One factor to consider is the number of resilient contact elements expected to contact the probe card assembly. Another factor is the spring constant of each spring. Another factor is to consider how much the probe card should yield when the probe card is overdriven. In general, if the spring constant per resilient contact element is $k_s$, then for n springs the effective spring rate of contacted springs is $nk_s$. In one preferred embodiment, the spring rate for the probe card $k_{pcb}$ is greater than or equal to $nk_s$. It is particularly preferred that the $k_{pcb}$ be on the order of 2 times $nk_s$.

One particularly preferred mode of operation is to have the overtravel stops evenly meet the probe card assembly then provide little or no additional force.

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. A probe card assembly comprising:
   a probe card comprising a plurality of electrical contacts;
   a probe substrate having a plurality of contact pads positioned for contacting raised contact elements of a device to be probed;
   a second substrate disposed between and spaced from the probe card and the probe substrate; and
   a plurality of elongate, resilient interconnection elements providing resilient electrical connections through the second substrate between the probe card and the probe substrate and thereby electrically connecting ones of the electrical contacts with ones of the contact pads.

2. The probe card assembly of claim 1, wherein the plurality of elongate interconnection elements extend from opposing surfaces of the second substrate.

3. The probe card assembly of claim 1, wherein each of the plurality of elongate interconnection elements is disposed such that each of the elongate interconnection element passes through an opening in the second substrate, opposite ends of each the elongate interconnection element being spaced from the opposing surfaces of the interconnect structure.

4. The probe card assembly of claim 1, wherein the plurality of elongate interconnection elements exert forces against the probe card and the probe substrate.

5. The probe card assembly of claim 4, wherein the forces are spring forces.

6. The probe card assembly of claim 1, wherein at least one of the elongate interconnection elements comprises a core of a first material and a coating of a second material, wherein the second material is more resilient than the first material.

7. The probe card assembly of claim 1, further comprising means for changing a planarity of the contact pads of the probe substrate.

8. The probe card assembly of claim 1, further comprising at least one moveable element disposed so as to change a planarity of the contact pads of the probe substrate.

9. The probe card assembly of claim 8, wherein the moveable element is threaded.

10. The probe card assembly of claim 8, wherein the moveable element comprises a screw.

11. The probe card assembly of claim 10, wherein the screw comprises a differential screw.

12. The probe card assembly of claim 1, further comprising at least one moveable element disposed so that movement of the element in a first direction causes at least a portion of the probe substrate to move toward the probe card.

13. The probe card assembly of claim 12, wherein movement of the moveable element in a second direction allows at least a portion of the probe substrate to move away from the probe card.

14. The probe card assembly of claim 1, further comprising a plurality of moveable elements, each disposed so as to affect a position of a portion of the probe substrate with respect to a portion of the probe card.

15. The probe card assembly of claim 1, wherein the probe substrate comprises a space transformer.

16. The probe card assembly of claim 1, wherein the plurality of contact pads comprise a plurality of posts each extending from the probe substrate.

17. The probe card assembly of claim 1, wherein a length by which each of the interconnection elements extends away from the second substrate is at least approximately twice a cross-sectional width of the interconnection element.

18. The probe card assembly of claim 1, wherein the interconnection elements are springs.

19. A probe card assembly comprising:
probe card means for providing electrical contacts to a tester;
probe substrate means for providing contact pad terminals to contact raised contact elements on a semiconductor device under test; and
interconnection means for flexibly connecting electrically the probe card means and the probe substrate means at a plurality of variations of a planar orientation of the probe substrate means with respect to the probe card means, wherein the interconnection means comprises a plurality of elongate interconnection elements for resiliently connecting electrically ones of the electrical contacts of the probe card means with ones of the contact pad terminals of the probe substrate means.

20. The probe card assembly of claim 19, further comprising means for changing a planarity of the contact pad terminals of the probe substrate means.

21. The probe card assembly of claim 19, wherein the interconnection elements are springs.

22. A probe card assembly comprising:
a probe card comprising a plurality of electrical contacts;
a probe substrate moveably attached to the probe card and comprising a plurality of contact pad elements, ones of the contact pad elements being in electrical communication with ones of the electrical contacts; and
a moveable element disposed so as to change a planar orientation of the probe substrate with respect to the probe card while the probe substrate is attached to the probe card.

23. The probe card assembly of claim 22, wherein movement of the moveable element in a first direction causes at least a portion of the probe substrate to move away from the probe card.

24. The probe card assembly of claim 22, wherein movement of the moveable element in a second direction allows at least a portion of the probe substrate to move toward the probe card.

25. The probe card assembly of claim 22, wherein the moveable element is threaded.

26. The probe card assembly of claim 22, wherein the moveable element comprises a screw.

27. The probe card assembly of claim 26, wherein the screw comprises a differential screw.

28. The probe card assembly of claim 22, further comprising a plurality of the moveable elements.

29. The probe card assembly of claim 22, wherein the probe substrate comprises a space transformer.

30. The probe card assembly of claim 22, wherein the contact pad elements comprise raised contact elements.

31. The probe card assembly of claim 22, wherein:
ends of the contact pad elements are disposed in a plane,
the planar orientation of the probe substrate comprises an angle of the plane with respect to a surface of the probe card, and
the movable element is disposed to change the angle.

32. The probe card assembly of claim 22, further comprising means for applying a biasing force biasing the probe substrate towards the probe card.

33. A probe card assembly comprising:
probe card means for providing an interface to a semiconductor tester;
substrate means for supporting a plurality of contact pad probe elements, the probe elements being in electrical communication with the probe card means, the probe substrate means being moveably attached to the probe card means; and
means for changing a planar orientation of the substrate means with respect to the probe card means while the substrate means is attached to the probe card means.

34. The probe card assembly of claim 33, wherein the probe elements comprise posts.

35. The probe card assembly of claim 33, further comprising interposer means disposed between the probe card means and the substrate means for exerting forces against the probe card means and the substrate means.

36. The probe card assembly of claim 33, wherein:
contact portions of the probe elements are disposed in a plane,
the planar orientation of the substrate means comprises an angle of the plane with respect to a surface of the probe card means, and
the means for changing changes the angle.

37. The probe card assembly of claim 33 further comprising means for applying a biasing force biasing the substrate means towards the probe card means.

* * * * *